(12) United States Patent
Sheelavant et al.

(10) Patent No.: US 10,872,749 B2
(45) Date of Patent: Dec. 22, 2020

(54) TEXTURED SKIN FOR CHAMBER COMPONENTS

(71) Applicant: Applied Materials, Inc., Santa Clara, CA (US)

(72) Inventors: Gangadhar Sheelavant, Karnataka (IN); Cariappa Achappa Baduvamanda, Bangalore (IN); Kaushik Vaidya, Bangalore (IN); Bopanna Ichettira Vasantha, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/659,617

(22) Filed: Jul. 26, 2017

(65) Prior Publication Data

US 2018/0076010 A1    Mar. 15, 2018

Related U.S. Application Data

(60) Provisional application No. 62/430,096, filed on Dec. 5, 2016, provisional application No. 62/393,879, filed on Sep. 13, 2016.

(51) Int. Cl.
| | | |
|---|---|---|
| *H01J 37/32* | (2006.01) |
| *H01J 37/34* | (2006.01) |
| *C23C 16/458* | (2006.01) |
| *C23C 16/44* | (2006.01) |
| *B33Y 80/00* | (2015.01) |
| *C23C 16/455* | (2006.01) |

(52) U.S. Cl.
CPC ........ *H01J 37/32853* (2013.01); *B33Y 80/00* (2014.12); *C23C 16/4404* (2013.01); *C23C 16/4581* (2013.01); *C23C 16/45565* (2013.01); *H01J 37/32477* (2013.01); *H01J 37/3488* (2013.01)

(58) Field of Classification Search
CPC ................. H01J 37/32853; H01J 37/3488
See application file for complete search history.

(56) References Cited

U.S. PATENT DOCUMENTS

| | | | | |
|---|---|---|---|---|
| 8,298,379 B2* | 10/2012 | McHugh | ............... | C23C 14/564 |
| | | | | 204/192.1 |
| 2004/0206804 A1* | 10/2004 | Kim | ................... | C23C 14/3407 |
| | | | | 228/199 |

(Continued)

OTHER PUBLICATIONS

International Search Report and Written Opinion for PCT/US2017/043683 dated Nov. 8, 2017.

*Primary Examiner* — John J Brayton
(74) *Attorney, Agent, or Firm* — Patterson + Sheridan, LLP (57) ABSTRACT

A chamber component for a processing chamber is disclosed herein. In one embodiment, a chamber component for a processing chamber has a base component body. The base component body has an exterior surface configured to face a processing environment of the processing chamber. A textured skin is conformable to the exterior surface. The textured skin has a first side configured to be disposed against the exterior surface and a second side facing away from the first side. The second side has a plurality of engineered features configured to enhance adhesion of material deposited on the textured skin during use of the processing chamber.

20 Claims, 7 Drawing Sheets

(56) References Cited

U.S. PATENT DOCUMENTS

| | | |
|---|---|---|
| 2004/0262155 A1* | 12/2004 | Lombardi ............... C23C 14/54 |
| | | 204/298.01 |
| 2007/0056688 A1* | 3/2007 | Kim ....................... B24C 1/003 |
| | | 156/293 |
| 2007/0158188 A1* | 7/2007 | Ivanov .................. C23C 14/564 |
| | | 204/298.02 |
| 2009/0120462 A1 | 5/2009 | West et al. |
| 2010/0247763 A1 | 9/2010 | Coutu et al. |
| 2014/0272341 A1 | 9/2014 | Duan et al. |
| 2016/0233060 A1 | 8/2016 | Narendrnath et al. |

* cited by examiner

TEXTURED SKIN FOR CHAMBER COMPONENTS

CROSS-REFERENCE TO RELATED APPLICATIONS

This application claims benefit of U.S. Provisional Application Ser. No. 62/393,879, filed Sep. 13, 2016 and U.S. Provisional Application Ser. No. 62/430,096, filed Dec. 5, 2016, both of which are incorporated by reference in their entirety.

BACKGROUND OF THE INVENTION

Field of the Invention

Embodiments of the present invention generally relate to plasma processing chambers for fabricating microelectronic devices and, more specifically, for chamber components used in the manufacturing of semiconductor devices

Description of the Related Art

Reliably producing sub-half micron and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

The manufacture of the sub-half micron and smaller features rely upon a variety of processing chambers, such as physical vapor deposition chambers, chemical vapor deposition chambers, and etch chambers among others. Many processing chambers have components exposed to a processing region within the processing chamber that may be covered by material while the processing chamber is processing a substrate therein. Undesirably, the materials that adhere to the chamber components during the operation of the processing chamber may shed particles or flake off during operation of the processing chamber. The flaking of the deposited material results in increased contamination (i.e., particles) of the interior of the processing chamber which undesirably contributes to substrate defects and low yield. Thus, avoidance of contamination undesirably demands increased frequency for cleaning and replacement of the processing chamber components.

Therefore, there is a need for improved processing chamber components.

SUMMARY

A chamber component for a processing chamber is disclosed herein. In one embodiment, a chamber component for a processing chamber has a base component body. The base component body has an exterior surface configured to face a processing environment of the processing chamber. A textured skin is conformable to the exterior surface. The textured skin has a first side configured to be disposed against the exterior surface and a second side facing away from the first side. The second side has a plurality of engineered features configured to enhance adhesion of material deposited on the textured skin during use of the processing chamber.

In another embodiment, an engineered film for a shield of a processing chamber is disclosed herein. The engineering film has a base. The base has a process facing surface and a bottom surface opposite the processing facing surface. The base is conformal to the processing shield. A plurality of engineered features is disposed on the process facing surface and configured to enhance adhesion of material deposited on the textured skin during use of the processing chamber. The engineering film additionally has an interlock feature.

In yet another embodiment, a processing chamber has a body. The body has walls, a lid and a bottom defining a processing volume therein. A chamber component is disposed in and exposed to the processing volume. The chamber component for a processing chamber has a base component body. The base component body has an exterior surface configured to face a processing environment of the processing chamber. A textured skin is conformable to the exterior surface. The textured skin has a first side configured to be disposed against the exterior surface and a second side facing away from the first side. The second side has a plurality of engineered features configured to enhance adhesion of material deposited on the textured skin during use of the processing chamber.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION 3D printing is a technique of manufacturing three dimensional components by laying down successive thin layer of material. 3D Printing can be used in Semiconductor industry for manufacturing semiconductor processing chamber components for plasma processing chambers to provide improved adhesion of deposition material on the surface of the chamber component. In a 3D printing process, a thin layer of precursor, e.g., a powder or other feed stock material is progressively deposited and fused to form a full 3-dimensional textured exterior for a component of the processing chamber. This additive manufacturing technique enables surfaces of the chamber component to be engineered to provide improved film adhesion, which inhibits flaking of the film from the chamber component where the flakes become a process contaminant. This additive manufacturing technique may additionally or alternatively enable surfaces of the chamber components to be engineered to minimize thermal temperature changes during processing across the surface of the component, which in turn results in a lower film stress for materials adhered to the surface of the chamber component. In some embodiments, a single step production may produce monolithic components which may be formed from one or more material layers. The material layers, may be optimize for providing localized strength, cost savings, heat transfer, optical reflectivity, or other beneficial properties. Although 3D printing is described as advantageously enabling the geometric form of the chamber component, it is contemplated that chamber components having similar geometry may be fabricated utilizing other manufacturing techniques. In other embodiments a 3D printed texture skin is formed which is configured to fit over other surfaces of the chamber component that would be exposed to the processing environment of the plasma processing chamber. The 3D skin may be adhered, mechanically fixed or attached to the chamber component through other suitable techniques. In some embodiments, the 3D skin may be removed and replaced with another 3D textured skin. Thereby allowing fast and cost effective refurbishing of used chamber components.

Implementations of the invention may include one or more of the following. A chamber component having an outer surface, either integrally to the component or as a skin, configured with engineered surface features that improve adhesion of deposition materials from the process chamber, and thus reducing the tendency of the deposited material to flake off over time. The engineered surface features are generally a repetitive pattern of recessed, projecting or mixed surface structures that interrupt the macro-level surface contour defining the shape of the feature. Additionally, the macro-level surface contour may have similar, albeit small in scale, micro-level surface features disposed thereon. The chamber component may be formed from a plurality of layers, wherein a thickness of each layer of the plurality of layers may be less than 66 µm (micro-meters). Recesses and projections forming the features may optionally be formed in internal portions of the chamber component when desired.

In embodiments wherein the chamber component is fabricated using 3D printing, the chamber component printed material may solidify using a curing process. The chamber component may be formed from a material precursor which includes properties which demonstrate resistance to high temperatures. Abrasives or other particles may be supplied in the precursor material utilized to fabricate the chamber component which enhances texturing of the surface for the chamber component. Additionally, a plurality of printed precursor materials may be used in forming different portions of the chamber component. The chamber component precursor material may alternately be a melted material which is solidified by cooling. Alternately, the chamber component may be formed using a separate manufacturing technique and texturing of the surface may be formed using a subsequent additive technique of manufacturing.

Advantages of the invention may include one or more of the following. A chamber component which can be manufactured within very tight tolerances, i.e., good thickness uniformity and control. Grooves and other geometric features may be formed in the chamber component in portions not accessible using traditional manufacturing methods. Additive manufacturing enables complex shapes and geometries that are difficult or impossible to replicate with traditional methods of manufacturing. Additionally, the 3D printed chamber component may be manufactured faster and cheaper than other similarly shaped conventional chamber component.

Figure 1:
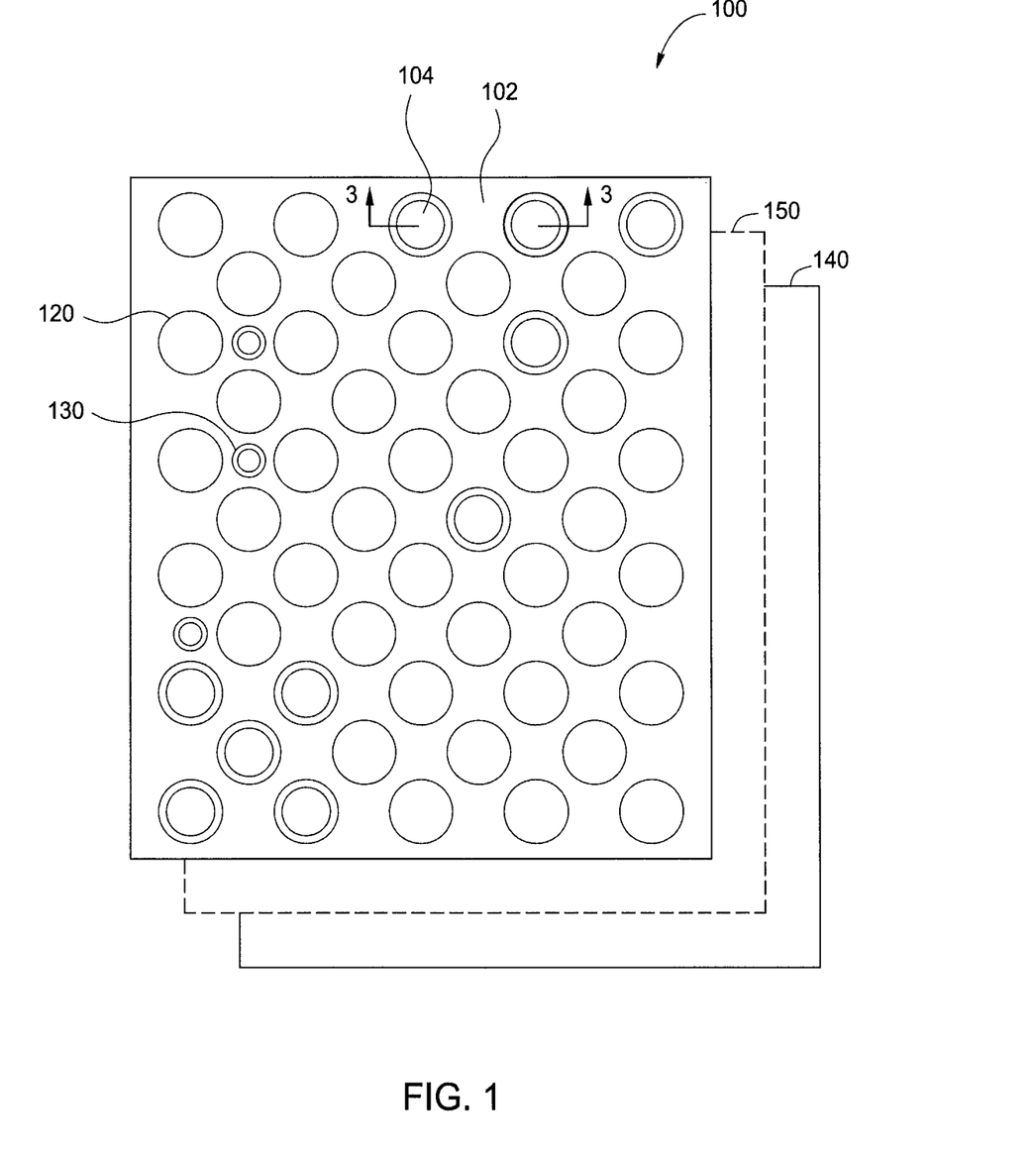
FIG. 1 is partial plan view of a textured skin of a processing chamber component.

FIG. 1 is partial plan view of a textured skin 102 of a processing chamber component 100. The chamber component 100 may have an underlying body 140 having unitary monolithic construction. The body 140 may have a textured skin 102. The textured skin 102 may be attached or formed directly on the body 140. For example, the textured skin 102 may be machined, such as milling, laser ablated, 3D printed, or formed thereon by other manufacturing techniques. Alternately, the chamber component 100 may have the textured skin 102 added in a secondary operation. For example, the textured skin 102 may have an interlock feature, such as an adhesive film 150, which secures the textured skin 102 to the chamber component. The adhesive film 150 may optionally bond the textured skin 102 to the chamber component 100. In yet other alternatives, the textured skin 102 may be mechanically fastened to the chamber component 100. In one example, the textured skin 102 may be supplied on material having a different thermal expansion than the chamber component 100 and is firmly held in place by the dissimilar materials pressing against each other by thermal expansion. The textured skin 102 may be provided as a tubular sheet placed inside the chamber walls or liner, the textured skin 102 having a thermal expansion greater than the chamber component and expanding outward against the chamber component to form a press-fit. In a second example, the textured skin 102 may have features or fasteners that interact with either the textured skin 102, the chamber component 100 or other features to hold the textured skin 102 in place.

The textured skin 102 may be removably disposed on the exterior surfaces of the body 140 for the chamber component 100 which are exposed to the processing environment of the processing chamber, and thus subject to deposition thereon. In this manner the textured skin 102 may be replaced without replacing the chamber component 100.

The textured skin 102 may be a large scale (macro) texture which includes a predefined pattern of engineered features 104. The term "engineered features" means that the general shape and arrangement of the features defining the surface of the chamber component are formed utilizing an additive manufacture process, such as 3D printing or other precision fabrication technique, that produces a predefined geometric shape on the surface of the chamber component such that a predefined pattern of high tolerance structures is formed. For example, bead blasting a surface would not be considered forming engineered features 104 thereon. The engineered features 104 may have a shape and arrangement of apertures formed while 3D printing the underlying body 140 of the chamber component 100. The engineered features 104 may have shapes or configurations only achievable via additive manufacturing. Alternately, the engineered features may be formed by laser ablation, milling, or other techniques suited for forming discrete planed shapes at planed locations. The engineered features 104 may be at least partially recessed below the textured skin 102 or above the textured skin 102. The engineered features 104 may also be substantially coplanar with the textured skin 102 of the chamber component 100. The engineered features 104 may be contiguously connected, or be discrete forms.

The engineered features 104 are configured to reduce film stress and/or tune the thermal conductivity of the underlying camber component 100. The engineered features 104 may have a shape and form different from adjacent engineered features 104. The engineered features 104 formed as part of the textured skin 102 may be arranged in a repetitive or random manner. For example, the engineer features may be arranged in a repetitive pattern of small toroids, chainmail, scales, ripples, egg-carton like texture, knurled diamond shapes, close-packed shapes, dimples, groves, protrusions, and sinusoidal wave-like profiles, among other patterns. In one embodiment the engineered features 104 are arranged to avoid creation of an uninterrupted planar surface extending between the engineered features 104, for example, by arranging the engineered features 104 in a pattern or other arrangement that prevents a line of sight surface from being formed between the engineered features 104 across the textured skin 102. Additionally, the pattern of the engineered features 104 may be formed in a manner such that the features do not overlap apertures, such as gas holes, or other features.

The engineered features 104 may encompass a plurality of sizes and shapes. For example, the pattern of the engineered features 104 may have both larger features 120 and smaller features 130. In other embodiments, there may be additional features which may be larger or smaller then either the larger features 120 or the smaller features 130. In yet another embodiment, the engineered features 104 may be similarly sized and arranged in a pattern. The pattern may be arranged such that there is no line of sight surface defined between the engineered features 104. Beneficially, a processing chamber component 100 having a textured skin 102 with no line of sight surfaces defined between the engineered features 104 forming the textured skin 102 eliminates long uninterrupted linear surfaces which are susceptible to peeling of deposited material and/or easily shed particles. Thus, processing chamber component 100 having a textured skin 102 with no line of sight surfaces defined between the engineered features 104 allow for longer service intervals between cleaning with diminished risk of deposited film flaking, thereby improving product yields, reduced maintenance requirements and more profitable operation of processing chambers in which the chamber component 100 having the textured skin 102 is utilized.

As discussed above, the engineered features 104 may have any number of geometric shapes, and the shapes do not have to be uniform across the textured skin 102. Although the engineered features 104 are shown in plan view as circles the engineered features 104 may have complex shapes such as polygonal or irregular shapes, among others. Additionally, the spacing between the engineered features 104 distribution across the textured skin 102 may be uniform or irregular in shape and size.

Suitable techniques for 3D printing techniques for forming the engineered features 104 on the textured skin 102 may generally include directed energy deposition, powder bed fusion, or sheet lamination among other techniques. For example, a polyjet 3D technique is a layer additive technology with layers as thin as 16 microns (0.0006"). The polyjet rapid prototyping process uses high resolution ink-jet technology combined with UV curable materials to create highly detailed and accurate layers or surface finishes in the engineered features 104. In another example, the 3D printer uses fused deposition modeling (FDM) to additively lay material down in layers. A filament or wire of the coil cup material is unwound from a coil and fused together to produce the engineered features 104. In yet another example, the 3D printer inkjets a binder into a powder bed. This technique is known as "binder jetting" or "drop-on-powder". The powder bed may contain additives as well as base materials for producing features and characteristics in the engineered features 104. The inkjet print head moves across a bed of powder, selectively depositing a liquid binding material. A thin layer of powder is spread across the completed section and the process is repeated with each layer adhering to the last. In another example, the engineered features 104 may be 3D printed using selective laser sintering. A laser or other suitable power source sinters powdered material by aiming the laser automatically at points in the powder defined by a 3D model. The laser binds the material together to create a solid monolithic structure. When a layer is finished, the build platform moves downward and a new layer of material is sintered to form the next cross section (or layer) of the engineered features 104. Repeating this process builds up the textured skin 102 and the engineered features 104 disposed thereon one layer at a time. Selective laser melting (SLM) uses a comparable concept, but in SLM the material is fully melted rather than sintered allowing for different crystal structure, porosity, among other properties. In another example, the engineered features 104 are generated using sheet lamination. The engineered features 104 may be manufactured by layering sheets of material on top of one-another and binding them together. The 3D printer then slices an outline of the engineered features 104 into the bound sheets of material. Repeating this process builds up the engineered features 104 one layer (sheet) at a time to form a monolithic structure. This structure can be part of a chamber component or bonded thereto. In yet another example, the engineered features 104 are generated using directed energy deposition (DEP). DEP is an additive manufacturing process in which focused thermal energy is used to fuse materials by melting them. The material may be fed into a molten pool created by an electron beam which is then guided by a computer to move about to form a layer of the engineered features 104 on a build platform to form a monolithic structure. It should be appreciated that example techniques are suitable for 3D printing the engineered features 104 as are other 3D printing techniques.

It should be appreciated that additives may be incorporated into the base material for generating surface textures or other features in the engineered features 104. For example, additives may be used to create porosity in the surfaces of the engineered features 104 for better adhesion of materials deposited during plasma processing. The additives may or may not have a homogenous concentration in the base material throughout the engineered features 104. The additives may gradually change in concentration in different areas of the engineered features 104. For example, the additives may gradually decrease or increase in concentration across the engineered features 104 in an edge to center relationship. Thus, the additives may have a larger concentration at or near the final surfaces (outermost surfaces) of the engineered features 104.

Pores or surface features may be formed on the surfaces of the engineered features 104 using additives such as inkjet bubbles, foamed UV curable features, reactive jetting or other techniques for creating pores. Porosity of the engineered features 104 can be achieved in the final cured material by rapid mixing of the viscous formulation, followed immediately by UV curing to trap the air bubbles in place. Alternatively, small bubbles of an inert gas (such as nitrogen) can be used as an additive and introduced to the formulation, mixed and immediately cured. Pores can also be achieved by adding porogens such as polyethylene glycol (PEG), polyethylene oxide (PEO), hollow particles, or microspheres, of about 5 nm to about 50 μm in diameter, e.g., gelatin, chitosan, $Si_3N_4$, polymethylmethacrylate (PMMA), mesoporous nanoparticles, carboxyl methyl cellulose (CMC), macroporous hydrogels and emulsion microspheres. Alternatively, a leeching technique can be employed by the combination of a salt particulate (NaCl) and PEG as co-porogens wherein the salt is subsequently leeched out to form the pores. Porosity can also be achieved by adding a UV activated species that generates gas & foaming (for example, with the help of a photoacid generator), e.g., the additional of a thermal initiator like 2,2'-Azobisisobutyronitrile (AIBN). Upon exposure to UV, the exothermic reaction of crosslinking causes the UV curable formulation to heat up which activates the AIBN, this also generates $N_2$ gas which is trapped during the curing process, leaving behind pores. Alternately, a UV curable polyurethane-acrylate (PUA) may have hollow nanoparticles for generating micropores.

The engineered features 104 may be formed directly on the chamber components or formed on a textured skin 102, such as sheet or other object, and bonded or otherwise attached to the chamber component 100. Turning briefly to FIGS. 6A-6D, some example techniques for attaching the textured skin 102 to the chamber component are illustrated. It should be appreciated by one skilled in the art that the examples provided in FIGS. 6A-6D for attaching the textured skin 102 to the chamber component 100 is not exhaustive and merely represents examples or illustration of a few techniques which may be used or modified to providing the textured skin 102 on the chamber component 100.

Figure 6A:
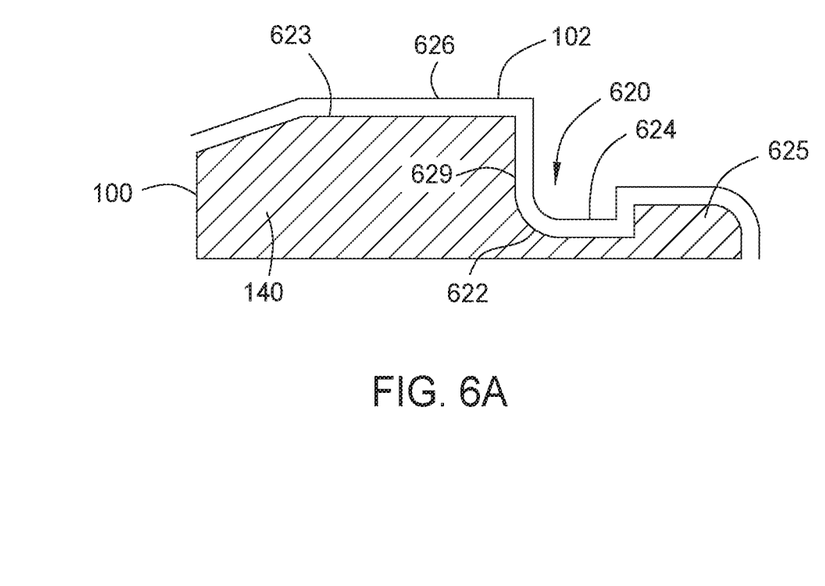
FIG. 6A illustrates one embodiment wherein the textured skin is conformally fit to the underlying body of the chamber component.

FIG. 6A illustrates one embodiment wherein the textured skin 102 is conformally fit to the underlying body 140 of the chamber component 100. The textured skin 102 may be molded, shrink fitted, press fitted, deposited on such as by 3D printed, or formed by other suitable techniques. The body 140 may have an exterior surface 623. The exterior surface 623 may have features such as low areas 622 (valleys, troughs and the like) as well as elevated areas 625. The elevated areas 625 and low areas 622 may have walls 629 therebetween. The textured skin 102 may have a bottom surface 611 in contact with or near the exterior surface 623. The textured skin 102 has low areas 624 and high areas 626 corresponding in shape and location to the low areas 622 and elevated areas 625 of the body. The bottom surface 611 of the textured skin 102 is conformal to the exterior surface 623, i.e., surface contours, of the body 140 upon which the textured skin 102 is disposed and held there in place by the features of the exterior surface 623. Opposite the bottom surface 611 is a top surface 620. The top surface 620 has a plurality of engineered features 104 configured to enhance adhesion of material deposited on the textured skin 102 during use of the processing chamber.

Figure 6B:
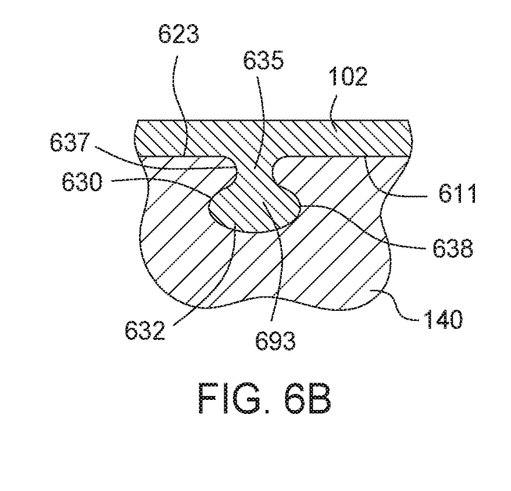
FIG. 6B illustrates a second embodiment wherein the textured skin has a feature which engages the underlying body of the chamber component.

FIG. 6B illustrates a second embodiment wherein the textured skin 102 has a first interlock feature 632 which engages the underlying body 140 of the chamber component 100. The body 140 may have a corresponding second interlock feature 630. The first interlock feature 632 may be formed in the textured skin 102 and designed to mate with the second interlock feature 630. The interlock features 632, 630 may form a mechanical bond and, when mated, attach the textured skin 102 to the body 140. For example, the first interlock feature 632 may have a stem 635 and a bulb 639. The bulb 639 may be rounded, oblong, flat or any suitable shape larger in profile than the stem 635. The bulb 639 and stem 635 may additionally be integral to each other. For example, the first interlock feature 632 may be pyramidal in shape with the peak acting as the stem and the base of the pyramid acting as the bulb 639. Other shapes or combinations of shapes are equally suitable. The stem 673 is narrower than the bulb 639 and disposed between the bulb 639 and the bottom surface 611 of the textured skin 102.

The second interlock feature 630 may have a profile containing a choke point 637 which opens up and extends through the exterior surface 623 of the body. Extending away from the exterior surface 623, the choke point 637 may open up to a larger cavity 638 in the body 140. Thus, the choke point 637 has an opening area that is smaller than that of the larger cavity 638. The first interlock feature 632, or the choke point 637, may deform to allow the second interlock feature 630 of the textured skin 102 to extend into the larger cavity 638 and be held therein by the choke point 637.

Figure 6C:
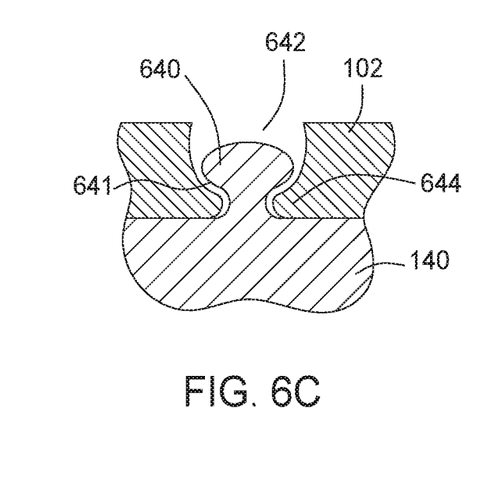
FIG. 6C illustrates a third embodiment wherein the underlying body of the chamber component has a feature which engages a feature of the textured skin.

FIG. 6C illustrates a third embodiment wherein the underlying body 140 of the chamber component 100 has an interlock feature 640 which engages the textured skin 102. The textured skin 102 may have a corresponding second interlock feature 642. For example, the second interlock feature 642 may be formed in the textured skin 102 and designed to mate with the interlock feature 640 to form a mechanical bond therebetween. The second interlock feature 642 may be a through hole, a blind hole or other shape configured to accept and engage the interlock feature 640 for supporting the textured skin 102 on the body 140. For example, the interlock feature 640 may have an upper portion 641 supported by a lower portion disposed on the exterior surface 623 of the body 140. The upper portion 641 may have a surface area taken through a cross-section substantially parallel to the exterior surface 623 which is greater than the surface area of the lower portion taken in a parallel plane thereto. The second interlock feature 642 may have a portion 644 disposed therein which engages with the interlock feature 640. The engagement of the interlock features 640, 642 may be substantially performed in a similar manner as that described with respect to FIG. 6B.

Figure 5C:
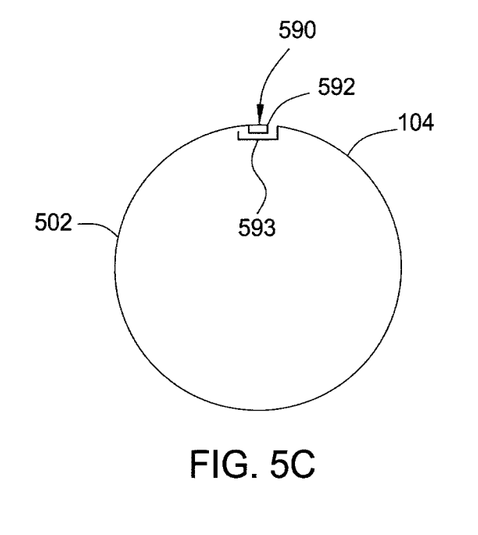
Figure 6D:
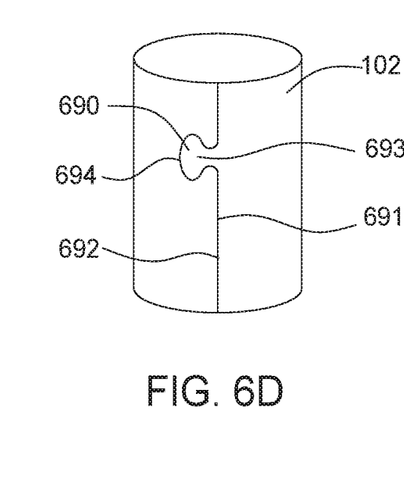
FIG. 6D illustrates a fourth embodiment wherein the textured skin has a feature configured to secure the textured skin back to itself.

FIG. 6D illustrates a fourth embodiment wherein the textured skin 102 has an interlock feature 690 configured to secure the textured skin 102 to itself. The interlock feature 690 may have one or more portions. For example, a first portion 693, for example a male coupling, may engage a second portion 694 for example a female coupling, of the interlock feature 690. Alternately, the first portion 693 may be configured to directly engage the textured skin 102. The first portion 693 may be disposed on the first end 691 of the engineered feature 104. The second portion 694 may be disposed on a second end 692 of the engineered feature 104. The interlock feature 690 may attach or secure the first end 691 to the second end 692. The shape of the first portion 693 may be of any suitable configuration for engaging an inversely shaped second portion 694. For example, the interlock feature 690 may form a clasp (such as shown in FIG. 5C), a post and socket, pintle gudgeon, T or ball fitting and receiver, or other suitable coupling structure.

Figure 2:
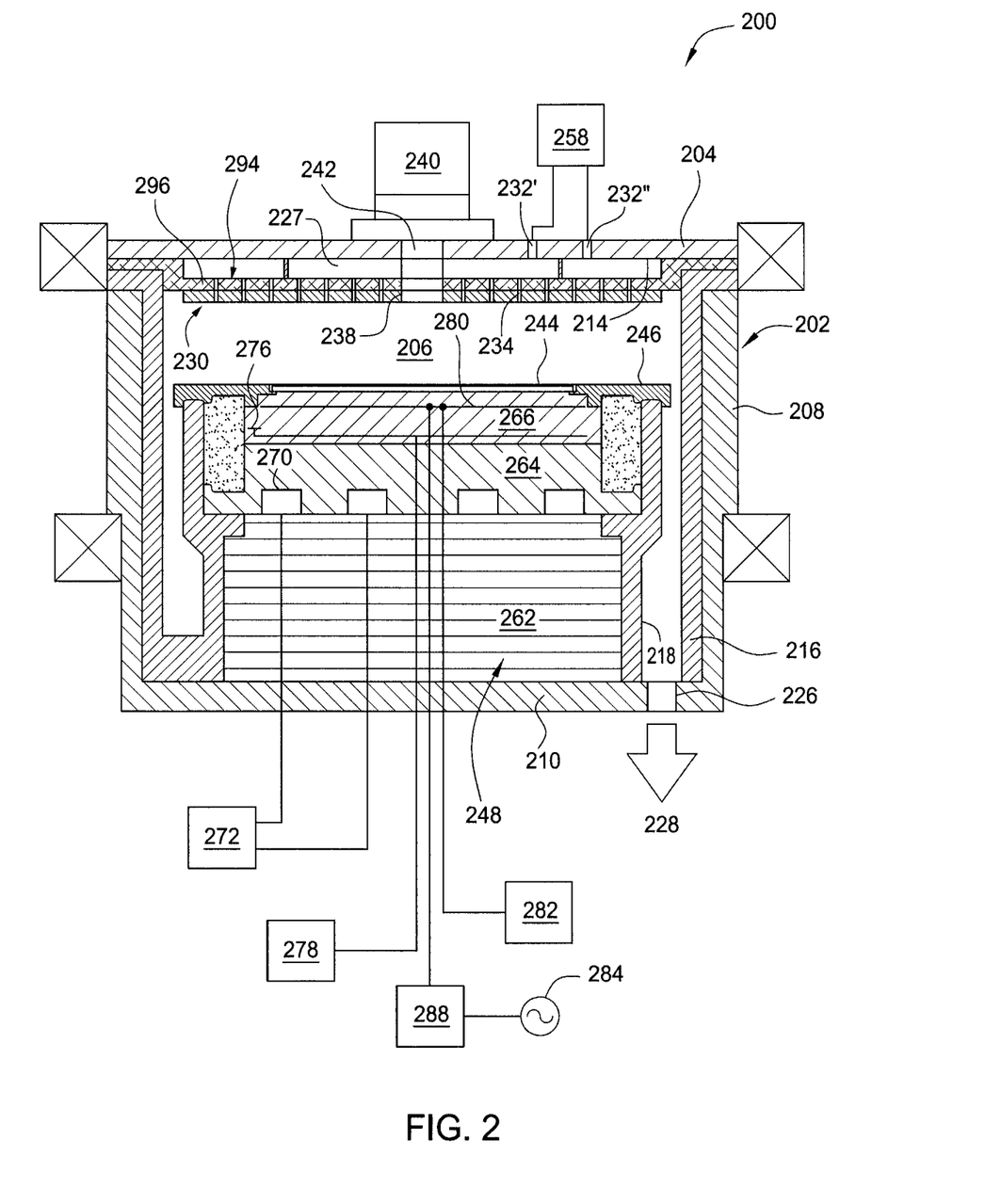
FIG. 2 is a sectional view of one embodiment of a semiconductor processing chamber having a gas distribution assembly.

Example implementations of engineered features 104 are further described below with references to an embodiment for a gas distribution plate shown in FIGS. 2 through 4 and a chamber liner in FIGS. 5 and 6. FIG. 2 is a sectional view of one embodiment of a semiconductor processing chamber 200 having a gas distribution assembly 230. The processing chamber 200 includes a chamber body 202 and a lid 204 which enclose an interior volume 206.

The chamber body 202 is typically fabricated from aluminum, stainless steel or other suitable material. The chamber body 202 generally includes sidewalls 208 and a bottom 210. A substrate access port (not shown) is generally defined in the sidewall 208 and is selectively sealed by a slit valve to facilitate entry and egress of a substrate 244 from the processing chamber 200.

An outer liner 216 may be positioned against or on the sidewalls 208 of the chamber body 202. The outer liner 216 may be fabricated from aluminum oxide and/or coated with a plasma or halogen-containing gas resistant material such as yttria, yttria alloy or an oxide thereof such as $Y_2O_3$.

An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one embodiment, the pump system 228 maintains the pressure inside the interior volume 206 at operating pressures typically between about 10 mTorr to about 20 Torr.

The lid 204 is sealingly supported on the sidewall 208 of the chamber body 202. The lid 204 may be opened to allow excess to the interior volume 206 of the processing chamber 200. The lid 204 may optionally include a window 242 that facilitates optical process monitoring. In one embodiment, the window 242 is comprised of quartz or other suitable material which permits the transmission of a signal utilized by an optical monitoring system 240.

A gas panel 258 is coupled to the processing chamber 200 to provide process and/or cleaning gases to the interior volume 206. Examples of processing gases may include halogen-containing gas, such as $C_2F_6$, $SF_6$, $SiCl_4$, HBr, $NF_3$, $CF_4$, $Cl_2$, $CHF_3$, $CF_4$, and $SiF_4$, among others, and other gases such as $O_2$, or $N_2O$. Examples of carrier gases include $N_2$, He, Ar, other gases inert to the process and non-reactive gases. Inlet ports 232', and optionally 232", are provided in the lid 204 to allow gases to be delivered from the gas panel 258 to the interior volume 206 of the processing chamber 200 through the gas distribution assembly 230.

A substrate support assembly 248 is disposed in the interior volume 206 of the processing chamber 200 below the gas distribution assembly 230. The substrate support assembly 248 holds the substrate 244 during processing. An edge deposition ring 246 is sized to receive the substrate 244 thereon while protecting the substrate support assembly 248 from plasma and deposited material. An inner liner 218 may be coated on the periphery of the substrate support assembly 248. The inner liner 218 may be a halogen-containing gas resistant material which is substantially similar to material used for the outer liner 216. In one embodiment, the inner liner 218 may be fabricated from the same material as that of the outer liner 216.

In one embodiment, the substrate support assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among other, to the base 264 and the electrostatic chuck 266.

At least one of the base 264 or the electrostatic chuck 266 may include at least one optional embedded heater 276 and a plurality of conduits 270 to control the lateral temperature profile of the substrate support assembly 248. The conduits 270 are fluidly coupled to a fluid source 272 that circulates a temperature regulating fluid therethrough. The heater 276 is regulated by a power source 278. The conduits 270 and heater 276 are utilized to control the temperature of the base 264, thereby heating and/or cooling the electrostatic chuck 266.

The electrostatic chuck 266 comprises at least one clamping electrode 280 controlled using a chucking power source 282. The electrode 280 may further be coupled to one or more RF power sources 284 through a matching circuit 288 for maintaining a plasma formed form process and/or other gases within the processing chamber 200. The sources 284 are generally capable of producing an RF signal having a frequency from about 50 kHz to about 3 GHz and a power of up to about 10,000 Watts.

The gas distribution assembly 230 is coupled to an interior surface 214 of the lid 204. The gas distribution assembly 230 may include a transmissive region or passage 238 suitable for allowing the optical monitoring system 240 to view the interior volume 206 and/or substrate 244 positioned on the substrate support assembly 248. The passage 238 includes a window 242 to prevent gas leakage from the passage 238.

The gas distribution assembly 230 includes a gas distribution plate 294 which may be coupled to or have a conductive base plate 296. The conductive base plate 296 may serve as an RF electrode. In one embodiment, the conductive base plate 296 may be fabricated by aluminum, stainless steel or other suitable materials.

The gas distribution assembly 230 has a plenum 227 defined between the lid 204 and the gas distribution plate 294. The gas distribution plate 294 may be a flat disc having a plurality of apertures 234 formed in the lower surface of the gas distribution plate 294 facing toward the substrate 244. The apertures 234 allow the gases to flow from the inlet port 232 (shown as 232', 232") through the plenum 227 and out the apertures 234 into the interior volume 206 of the processing chamber 200 in a predefined distribution across the surface of the substrate 244 being processed in the processing chamber 200. The gas distribution plate 294 may be fabricated from a ceramic material, such as silicon carbide, bulk Yttrium or oxide thereof to provide resistance to halogen-containing chemistries. Alternatively, the gas distribution plate 294 may be coated with yttria or an oxide thereof to extend the life time of the gas distribution assembly 230. The coating may include the textured skin 102 containing the engineered features 104. The textured skin 102 may be formed integral to the gas distribution plate 294 or applied thereto as a removable skin.

Figure 3A:
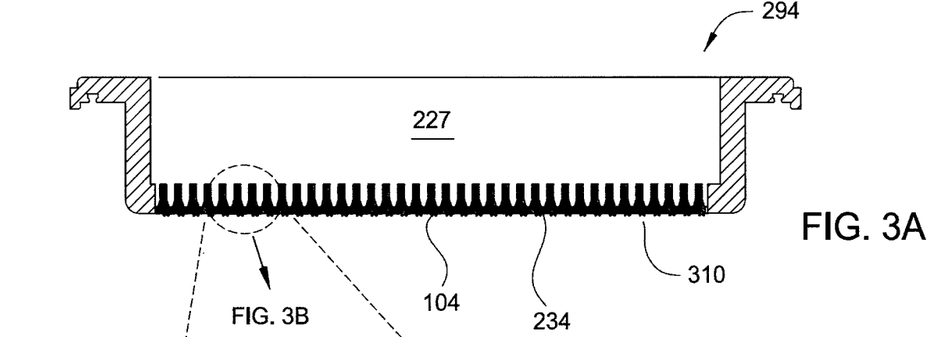
FIG. 3A is a cross-sectional view of a gas distribution plate of the shower head assembly shown in FIG. 2 having the textured skin of FIG. 1.
Figure 3B:
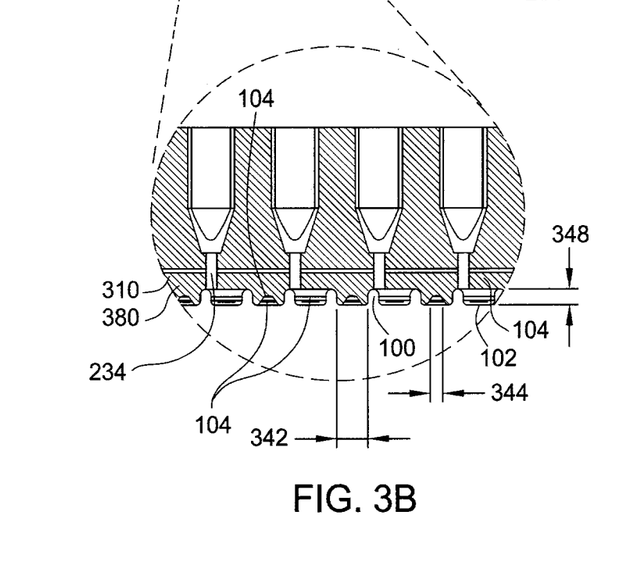
FIG. 3B illustrates a cross-sectional portion of the gas distribution plate of FIG. 3A having the textured skin.
Figure 3C:
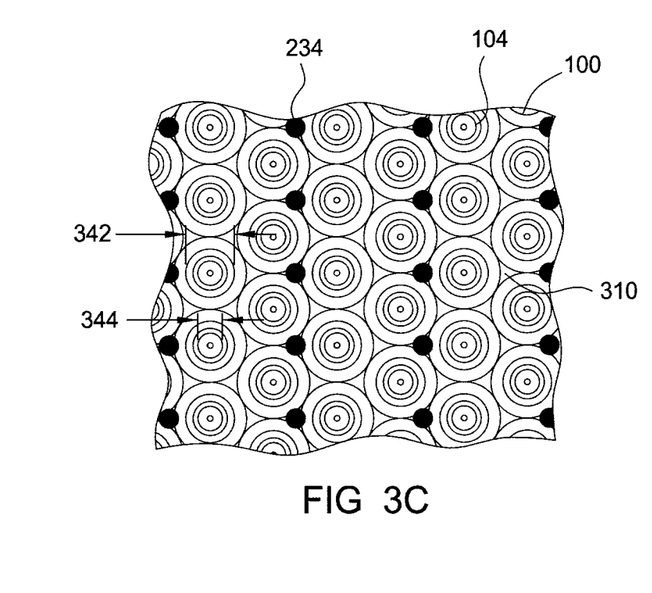
FIG. 3C illustrates a plan view of the textured skin disposed on a portion of the gas distribution plate of FIG. 3A.

Further discussion of the gas distribution plate 294 will be with reference to FIGS. 3A through 3C. The gas distribution FIG. 3A is a cross-sectional view of the gas distribution plate 294 of the shower head assembly shown in FIG. 2 having the textured skin of FIG. 1. FIG. 3B illustrates a cross-sectional portion of the gas distribution plate of FIG. 3A having the textured skin. FIG. 3C illustrates a plan view of the textured skin disposed on a portion of the gas distribution plate of FIG. 3A. The gas distribution plate 294 may be made from aluminum and other metals. The gas distribution plate 294 has a process facing surface 310 exposed to the interior volume 206 of the processing chamber 200. The apertures 234 are disposed through the process facing surface 310 and provide process gasses from the plenum 227 to the interior volume 206 of the processing chamber 200.

The engineered features 104 are disposed on the process facing surface 310. The engineered features 104 may be formed by 3D printing, electrochemical etching, or other suitable techniques. Alternately, the engineered features 104 may be formed on the textured skin and disposed on the process facing surface 310 as a skin 380. The skin 380 may be formed on a sheet material such as a ceramic, metal, polymer or other suitable material and attached to the process facing surface 310. This skin 380 may be easily and quickly replaced when servicing, e.g., film build up on the features, by removing the bond between the skin 380 and the process facing surface 310 while leaving the gas distribution plate 294 intact.

Although the engineered features 104 may have any shape as discussed with reference to FIG. 1, the following discussion will be with reference to an embodiment of the engineered features 104 shape being substantially toroid or donut shape. The engineered feature 104 may have an inner diameter 344 and an outer diameter 342. The inner diameter 344 is smaller than the outer diameter 342. The engineered features 104 may additionally have a height 348. The height 348 of the engineered feature 104 projects above the apertures 234 in the process facing surface 310.

The engineered features 104 may be disposed around each aperture 234, i.e., process gas holes. Alternately, the apertures 234, i.e., process gas holes may be disposed through the inner diameter 344 of the engineered feature 104. The engineered features 104 substantially prevent peeling of films which form on the process facing surface 310 of the gas distribution plate 294 during the processing of the substrates. Advantageously, the engineered features 104 therefore reduce chamber contamination and extend the service life of the gas distribution plate 294.

Figure 4:
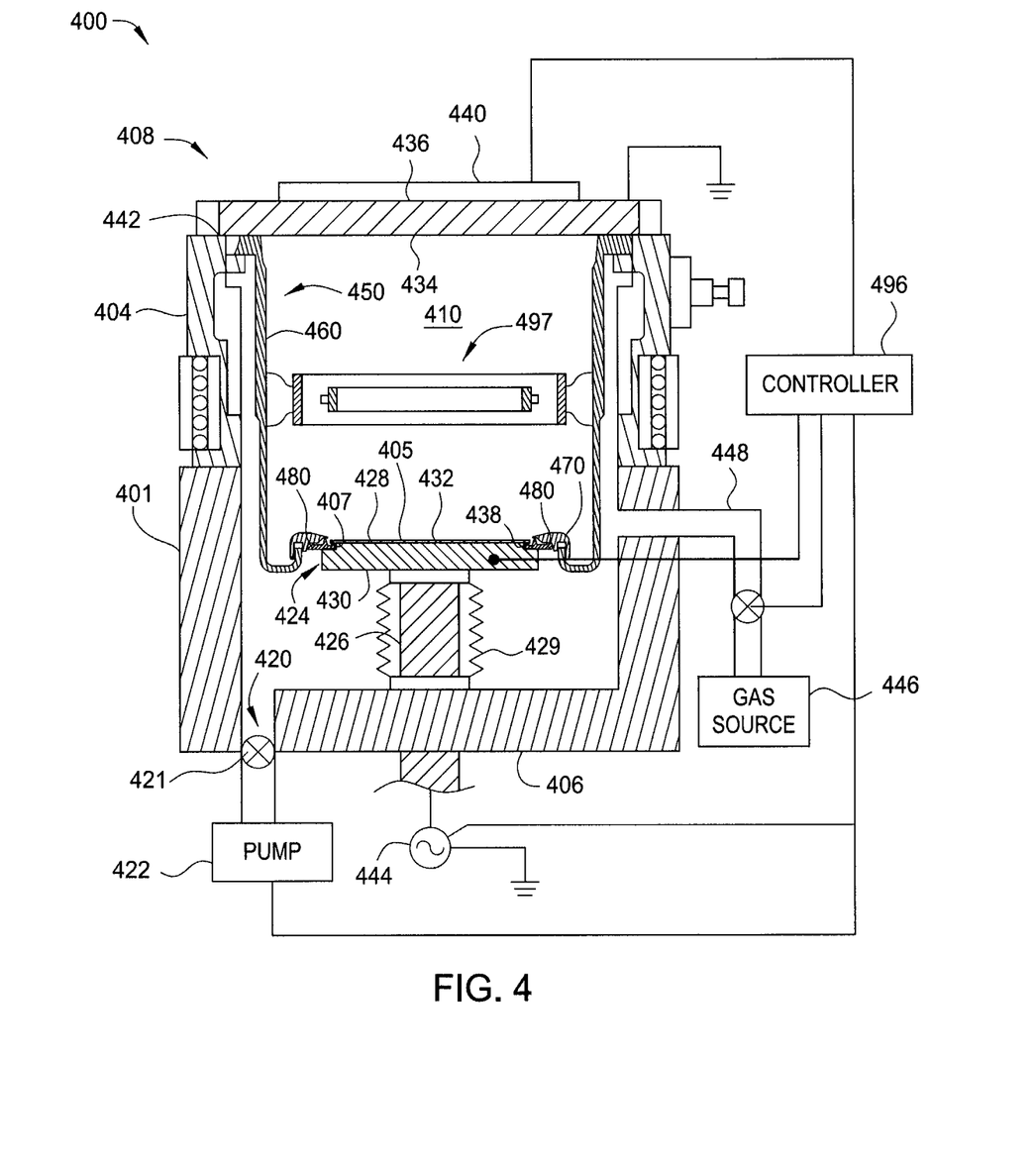
FIG. 4 is a simplified sectional view of a semiconductor processing system having one embodiment of a process kit containing a shield.

FIG. 4 depicts an exemplary semiconductor processing chamber 400 having one embodiment of a process kit 450 having a shield 460. The process kit 450 may also include an interleaving cover ring 470, and a deposition ring 480. In the embodiment shown, the processing chamber 400 comprises a sputtering chamber, also called a physical deposition or PVD chamber, capable of depositing titanium, aluminum oxide, aluminum, copper, tantalum, tantalum nitride, tungsten, or tungsten nitride on a substrate. Examples of suitable PVD chambers include the ALPS® Plus and SIP ENCORE® PVD processing chambers, both commercially available from Applied Materials, Inc., Santa Clara, of Calif. It is contemplated that processing chambers available from other manufactures may also be utilized to perform the embodiments described herein.

The processing chamber 400 includes a chamber body 401 having enclosure sidewalls 404, a bottom wall 406, and a lid assembly 408 that enclose an interior volume 410 or plasma zone. The chamber body 401 is typically fabricated from welded plates of stainless steel or a unitary block of aluminum. The sidewalls 404 generally contain a slit valve (not shown) to provide for entry and egress of a substrate 405 from the processing chamber 400. A pumping port 420 disposed in the sidewalls 404 is coupled to a pumping system 422 though an exhaust conduit 421. The pumping system 422 exhausts and controls the pressure of the interior volume 410. The pressure of the interior volume 410 of the processing chamber 400 is set to sub-atmospheric levels, such as a vacuum environment, for example, pressures of 5 mTorr to 400 mTorr. The lid assembly 408 of the processing chamber 400 works in cooperation with the shield 460 that interleaves with the cover ring 470 to confine a plasma formed in the interior volume 410 to the region above the substrate 405.

A pedestal assembly 424 is supported from the bottom wall 406 of the processing chamber 400. The pedestal assembly 424 supports the deposition ring 480 along with the substrate 405 during processing. The pedestal assembly 424 is coupled to the bottom wall 406 of the processing chamber 400 by a lift mechanism 426 that is configured to move the pedestal assembly 424 between an upper and lower position. In the lower position, lift pins may be moved through the pedestal assembly 424 to space the substrate 405 from the pedestal assembly 424 to facilitate exchange of the substrate 405 with a wafer transfer mechanism disposed exterior to the processing chamber 400, such as a single blade robot (not shown). A bellows 429 is typically disposed between the pedestal assembly 424 and the bottom wall 406 of the processing chamber 400 to isolate the interior volume 410 of the chamber body 401 from the interior of the pedestal assembly 424 and the exterior of the chamber.

The pedestal assembly 424 generally includes a substrate support 428 sealingly coupled to a platform housing 430. The platform housing 430 is typically fabricated from a metallic material such as stainless steel or aluminum. A cooling plate (not shown) is generally disposed within the platform housing 430 to thermally regulate the substrate support 428. One pedestal assembly 424 that may be adapted to benefit from the invention is described in U.S. Pat. No. 4,507,499, issued Apr. 16, 1996 to Davenport et al., which is incorporated herein by reference in its entirety.

The substrate support 428 also has a peripheral wall 438 that terminates before an overhanging edge 407 of the substrate 405. The substrate support 428 may be an electrostatic chuck, a ceramic body, a heater or a combination thereof. In one embodiment, the substrate support 428 is an electrostatic chuck that includes a dielectric body having a conductive layer embedded therein. The dielectric body is typically fabricated from a high thermal conductivity dielectric material such as pyrolytic boron nitride, aluminum nitride, silicon nitride, alumina or an equivalent material.

The substrate support 428 has a substrate receiving surface 432 that receives and supports the substrate 405 during processing, the substrate receiving surface 432 having a plane substantially parallel to a sputtering surface 434 of a sputtering target 436. The lid assembly 408 generally includes the sputtering target 436 and a magnetron 440. The magnetron 440 is coupled to the lid assembly 408 on the exterior of the, processing chamber 400. The magnetron 440 includes at least one rotating magnet assembly (not shown) that promotes uniform consumption of the sputtering target 436 during the PVD process. One magnetron which may be utilized is described in U.S. Pat. No. 5,953,827, issued Sep. 21, 1999 to Or et al., which is hereby incorporated by reference in its entirety.

The lid assembly 408 is supported by the sidewalls 404 when in a closed position. An isolator ring 442 is disposed between the sputtering target 436 and the shield 460 to prevent vacuum leakage therebetween and reduce electrical shorts between the chamber walls and the sputtering target 436. In one embodiment, the isolator ring 442 comprises a ceramic material. The sputtering target 436 is coupled to the lid assembly 408 and exposed to the interior volume 410 of the processing chamber 400. The sputtering target 436 provides material which is deposited on the substrate during a PVD process.

The sputtering target 436 and pedestal assembly 424 are biased relative to each other by a power source 444. A gas, such as argon, is supplied to the interior volume 410 from a gas source 446 via conduits 448. The gas source 446 may comprise a non-reactive gas such as argon or xenon, which is capable of energetically impinging upon and sputtering material from the sputtering target 436. The gas source 446 may also include a reactive gas, such as one or more of an oxygen-containing gas and a nitrogen-containing gas, that are capable of reacting with the sputtering material to form a layer on a substrate.

Plasma is formed between the substrate 405 and the sputtering target 436 from the gas. Ions within the plasma are accelerated toward the sputtering target 436 and cause material to become dislodged from the sputtering target 436. The dislodged target material is deposited on the substrate 405.

The processing chamber 400 is controlled by a controller 496 that comprises program code having instruction sets to operate components of the processing chamber 400 to process substrates in the processing chamber 400. For example, the controller 496 can comprise program code that includes a substrate positioning, gas flow control, pumping pressure control; temperature control and process monitoring to monitor the process in the processing chamber 400 among other instructions.

A collimator 497 is coupled with the shield 460, thereby grounding the collimator. In one embodiment, the collimator 497 may be a metal ring and includes an outer tubular section and at least one inner concentric tubular section, for example, three concentric tubular sections linked by struts. The collimator 497 may help maintain the plasma in the interior volume 410. The shield 460 may protect the sidewalls 404 of the processing chamber 400 from the plasma. The shield 460 comprises a material such as aluminum or stainless steel. The shield 460 may have engineered features 104 formed thereon and exposed to the plasma in the interior volume 410 of the processing chamber 400.

Figure 5A:
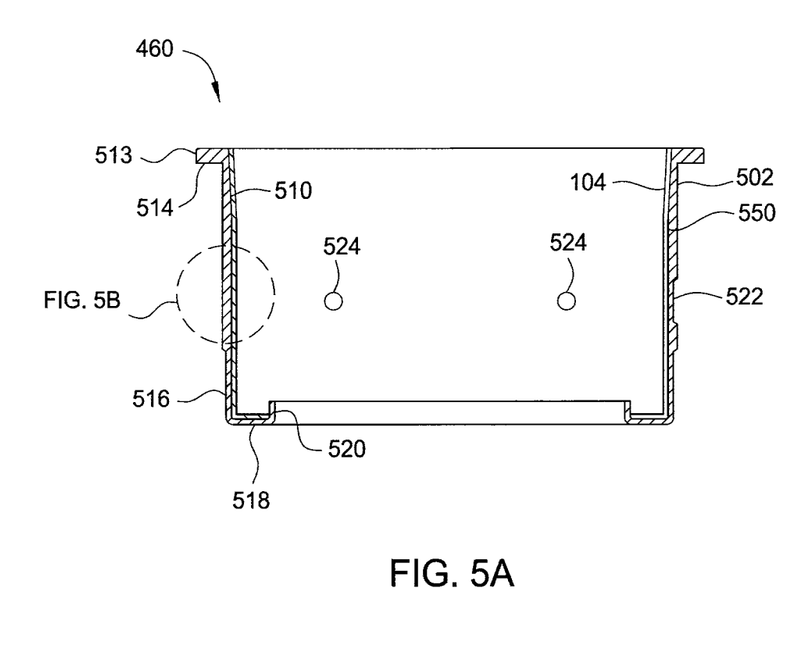
FIGS. 5A through 5C are partial sectional views of the one-piece shield having the textured skin of FIG. 1, according to one embodiment described herein.
Figure 5B:
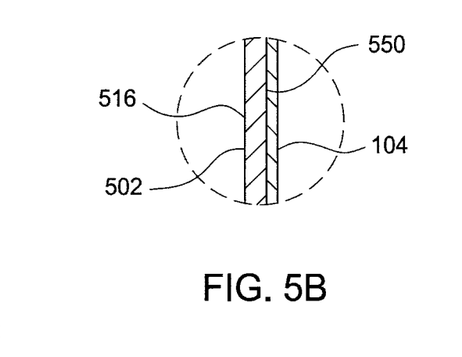

FIGS. 5A through 5C are partial sectional views of the shield 460 according to one embodiment described herein. The shield 460 may be of unitary construction and comprises a cylindrical outer band 502 having a diameter dimensioned to encircle the sputtering surface 434 of the sputtering target 436 and the substrate support 428. A support ledge 513 extends radially outward from the cylindrical outer band 502. The support ledge 513 comprises a resting surface 514 to rest upon the sidewalls 404 of the processing chamber 400. The resting surface 514 may have a plurality of slots shaped to receive a pin to align the shield 460 with the processing chamber 400.

Below the support ledge 513 of the shield 460 is a bottom wall 516 that surrounds the substrate support 428. A base plate 518 extends radially inward from the bottom wall 516 of the cylindrical outer band 502. A cylindrical inner band 520 is coupled with the base plate 518 and at least partially surrounding the peripheral wall 438 of the substrate support 428. The cylindrical inner band 520, the base plate 518, and the cylindrical outer band 502 form a U-shaped channel. The cylindrical inner band 520 comprises a height that is less than the height of the cylindrical outer band 502. In one embodiment, the height of the cylindrical inner band 520 is about one fifth of the height of the cylindrical outer band 502. In one embodiment, the bottom wall 516 has a notch 522. In one embodiment, the cylindrical outer band 502 has a series of gas holes 524.

The cylindrical outer band 502, the support ledge 513, the bottom wall 516, and the cylindrical inner band 520 comprise a unitary structure. For example, in one embodiment, the shield 460 can be made from 300 series stainless steel, or in another embodiment, aluminum. The shield 460 protects the sidewalls 404 from sputter deposition during process cycles.

The shield 460 has a process facing surface 510 exposed to the interior volume 410 of the processing chamber 400. The shield 460 has an engineered film 550 disposed on the process facing surface 510. The engineered film protects the process facing surface 510 from the sputtering deposits. The engineered film 550 may have a plurality of engineered features 104 substantially similar to the features shown in FIGS. 1 and 3A-3C. For example, the engineered features 104 may have a substantially toroid or donut shape and sized similarly to that described with reference to FIG. 3A-3C.

The engineered features 104 may be formed by 3D printing, electrochemical etching, making textured sheets, and through other suitable techniques. In one example, the engineered features 104 may be formed on the engineered film 550 such as a ceramic, metal, polymer or other suitable material. The engineered film 550 may be adhered to the process facing surface 510. Alternately, the engineered film 550 may have a thermal property different then the shield 460. The engineered film 550 may be sized to fit within the process facing surface 510 of the shield 460 at room temperature, i.e., 30 degrees Celsius. The engineered film 550 may expand at a greater rate than the shield 460 and form a firm press fit with the shield 460 when the processing chamber 400 is heated up for processing. In yet another alternative, the engineered film 550 may have a mechanical interlock 590. The mechanical interlock 590 may be a clasp like interlock wherein a first portion 592 extends into a second portion 593 as shown in FIG. 5C. The mechanical interlock 590 also utilize any of the closure techniques discussed with respect to FIGS. 6A through 6D or any other suitable closure.

Advantageously, the engineered film 550 may be easily and quickly removed without removing the shield 460. The bond between the engineered film 550 and the chamber component, such as shield 460, may be easily broken to facilitate the easy removal of the engineered film 550 from the shield 460. Thus, the engineered film 550 may be replaced with minimal down time and cost, for instance by removing the bond or loosening of the press fit when the processing chamber 400 is brought back to room temperature for servicing. In this manner, a new engineered film 550 may be placed on the shield 460 without removing the shield 460 from the chamber.

It should be appreciated that the engineered features 104 formed on the textured skin 102 or the engineered film 550 may have a variety of shapes and may be fabricated from one or more different materials. The engineered features 104 described herein need not be limited to engineered features 104 made or metal or metallic materials, as the engineered features 104 may also be made from ceramic materials that can be 3D printed. In one example, the engineered features 104 may have mushroom-type geometries. However, an endless variety of shapes may be 3D printed to form the engineered features 104. FIGS. 7A through 7G illustrate various embodiments of 3D printed engineered features 104. In one example, the 3D printed engineered features 104 disclosed herein do not have sharp corners. Sharp corners create stress concentrations. 3D printing of the engineered features 104 enables the formation of controlled textures which have well rounded edges and corners to avoid stress accumulation. The design of the textures can be customized based on substrate and materials utilized. Additionally, the engineered features need not be the same geometry throughout or across the entire textured surface.

Figure 7A:
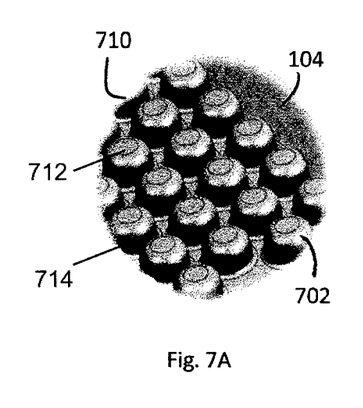
FIGS. 7A through 7G illustrate various embodiments of 3D printed engineered features.

FIG. 7A illustrates one embodiment of a first engineered feature 710. The first engineered features 710 may be shaped as a high aspect ratio (>1) post having a substantially flat top portion 712 and short walls 714. A fillet 702 may be formed between the short walls 714 and the flat top portion 712. In this manner, the first engineered feature 710 has no sharp edges that could concentrate stress on attached films. The spacing between individual first engineered features 710 may be customizable and configured accordingly.

Figure 7B:
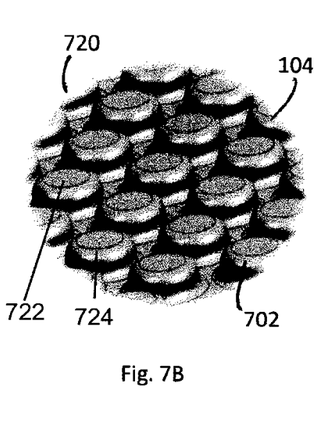

FIG. 7B illustrates a second embodiment of a second engineered feature 720. The second engineered features 720 may be shaped as a low aspect ratio (<1) post having a substantially flat top portion 722 and short walls 724. The short walls 724 may be flat, bowed, angled or any suitable configuration for promoting film adhesion. The flat top portion 722 of the second engineered features 720 may have a larger diameter than the flat top portion 712 of the first engineered features 710. A fillet 702 may be formed between the short walls 724 and the flat top portion 722. In this manner, there are no sharp edges that could concentrate stress in attached films. The spacing between individual second engineered features 720 may again be customizable and configured accordingly.

Figure 7C:
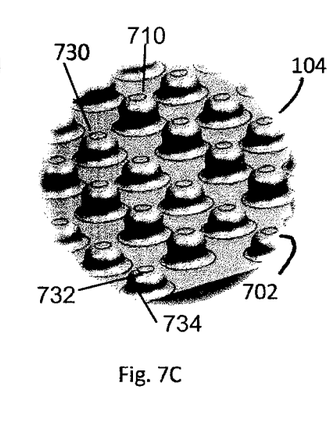

FIG. 7C illustrates a third embodiment of a third engineered feature 730. The third engineered features 730 may be shaped as a narrow post having a substantially flat top portion 732 and short walls 734. In the narrow post, the flat top portion 732 of the third engineered features 730 may have a smaller diameter than the flat top portion 712 of the first engineered features 710. Additionally, first engineered features 710 may be interspersed with the third engineered features 730 to create an irregular pattern. A fillet 702 may be formed between the short walls 734 and the flat top portion 732. In this manner there are no sharp edges for concentrating stress on attached films. The spacing between individual third engineered features 730, or other engineered features, may again be customizable and configured accordingly.

Figure 7D:
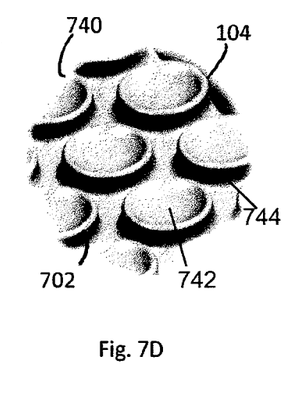

FIG. 7D illustrates a fourth embodiment for a fourth engineered feature 740. The fourth engineered features 740 may be shaped as a shallow dish having a convex top portion 742 and short walls 744. In the shallow dish, the convex top portion 742 of the fourth engineered features 740 may be sized to any suitable manner. A fillet 702 may be formed between the short walls 744 and the convex top portion 742. In this manner there are no sharp edges for concentrating stress on attached films. The spacing between individual fourth engineered features 740 may again be customizable and configured accordingly.

Figure 7E:
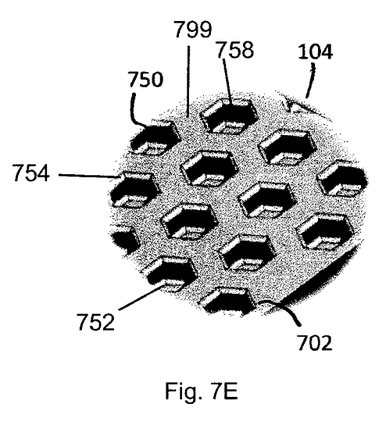

FIG. 7E illustrates a fifth embodiment for a fifth engineered feature 750. The fifth engineered features 750 may be shaped as an imprinted hexagon having a flat bottom 752 with short walls 754. The fifth engineered features 750 may be formed inward of a top surface 799 of the textured skin 102. In one embodiment, the walls 754 are vertical. In another embodiment, the walls 754 may have an undercut 758 which extends underneath the top surface 799. The undercut 758 may not be visible from above the top surface 799 and therefor formed by an additive manufacturing technique such as 3D printing. The undercut 758 may provide an anchor point for substantially aiding the adhesion of films thereon. A fillet 702 may be formed between the walls 754 and the top surface 799 of the textured skin 102. In this manner there are no sharp edges for concentrating stress on attached films. The spacing between individual fifth engineered features 750 may again be customizable and configured accordingly.

Figure 7F:
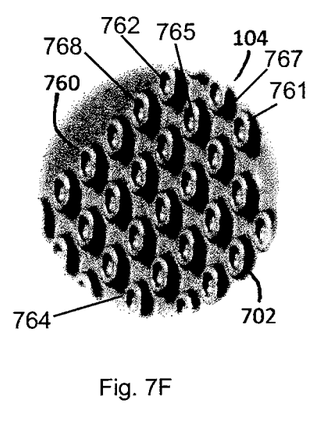

FIG. 7F illustrates a sixth embodiment for a sixth engineered feature 760. The sixth engineered features 760 may be shaped as a torus, donuts or other similar shaped having a top surface 761, an opening 762 through the top surface 761, and short exterior walls 764 and interior walls 765. The short walls 764, 765 may be straight, angled, bowed, or curved. In one embodiment, one or both of the walls 764, 765 are vertical. In another embodiment, one or both of the walls 764, 765 may have an angle or bow resulting in an outside undercut 768 or inside undercut 767 which extends underneath the top surface 761. The undercuts, 767, 768 may be formed by an additive manufacturing technique such as 3D printing due to limited, i.e., no access, from conventional tooling. The undercut 767, 768 may provide an anchor point for substantially aiding the adhesion of films thereon. A fillet 702 may be formed along the short walls 764 where the walls 764, 765 intersect the top surface 799 of the textured skin 102 or where the walls 764, 765 intersect the top surface 761 of the sixth engineered feature 760. In this manner there are no sharp edges for concentrating stress on attached films. The spacing between individual sixth engineered features 760 may again be customizable and configured accordingly.

Figure 7G:
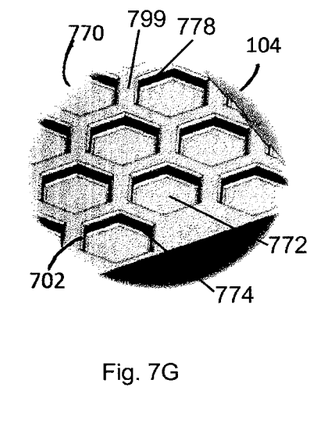

FIG. 7G illustrates a seventh embodiment for a seventh engineered feature 770. The seventh engineered features 770 may be shaped as a shallow hexagon having a flat bottom 772 and walls 774. The seventh engineered features 770 may be formed inward of the top surface 799 of the textured skin 102. In one embodiment, the walls 774 are vertical. In another embodiment, the walls 774 may have an undercut 778 which extends underneath the top surface 799. The undercuts 778 may provide an anchor point for substantially aiding the adhesion of films thereon. A fillet 702 may be formed between the short walls 774 and the top surface 799 of the textured skin 102. In this manner there are no sharp edges for concentrating stress on attached films. The spacing between individual fifth engineered features 750 may again be customizable and configured accordingly.

Advantageously, the additive method proposed to make the textures, i.e., engineered features 104, is repeatable with reproducibility precision for dimensions and quality unlike conventional additive manufacturing techniques. The texture promotes adhesion of materials to the chamber components during the operation of the processing chamber to prevent shedding particles or flake off during operation of the processing chamber. The undercut discussed with respect to FIGS. 7E through 7G may be extended to FIGS. 7A through 7D for promoting film adhesion. Thus, chamber contamination may be minimized due to materials (i.e., particles) undesirably shedding from the chamber component. The reduction in chamber contamination results in less substrate defects and higher yields. Thus, a decrease frequency for cleaning and replacement of the processing chamber components may be realized through better material adhesion due to the engineered features 104

While the foregoing is directed to embodiments of the present invention, other and further embodiments of the invention can be devised without departing from the basic scope thereof, and the scope thereof is determined by the claims that follow.

What is claimed is:

1. A chamber component for a processing chamber, the chamber component comprising:
a base component body having an exterior surface configured to face a processing environment of the processing chamber; and
a textured skin covering an entirety of the exterior surface facing the processing environment and conformable to the exterior surface, the textured skin comprising:
a first side configured to be disposed against the exterior surface and the first side conformal to the exterior surface;
a second side facing away from the first side, the first side and second side defining a thickness of the textured skin; and
a plurality of engineered features formed in a repetitive pattern and regularly spaced across the second side facing the processing environment while absent on the first side, wherein the engineered features are configured to enhance adhesion of material deposited on the textured skin during use of the processing chamber.

2. The chamber component of claim 1, further comprising:
an adhesive disposed between the textured skin and the base component body, wherein the adhesive bonds the textured skin thereto the base component body.

3. The chamber component of claim 1, wherein the textured skin is press fit to the base component body and bonded thereto.

4. The chamber component of claim 1, wherein the textured skin has an interlock feature that mechanically and removably interlocks the textured skin to the base component body.

5. The chamber component of claim 1, wherein the textured skin is shrink fit to the base component body to bond thereto.

6. The chamber component of claim 1, wherein the textured skin is 3D printed on the base component body.

7. The chamber component of claim 1, wherein the bond between the textured and the base component body is removable.

8. An engineered film for a shield of a processing chamber, the engineered film comprising:
a base having a process facing surface and a bottom surface opposite the process facing surface, the base being conformal to the shield;
a plurality of engineered features formed in a repetitive pattern and regularly spaced on the process facing surface and not on the bottom surface, the engineered features configured to enhance adhesion of material deposited on the engineered film during use of the processing chamber; and
an interlock feature configured to secure the engineered film covering the shield, wherein the base, the engineered features and the interlock feature form the engineered film.

9. The engineered film of claim 8, wherein the interlock feature is configured to allow the engineered film to be bonded to and removed from the shield while the shield is disposed in the processing chamber.

10. The engineered film of claim 9, wherein the interlock feature comprises:
a mechanical fastener comprised of a stem coupled to a bulb.

11. The engineered film of claim 9, wherein the interlock feature comprises:
an adhesive material.

12. The engineered film of claim 9, wherein the interlock feature comprises:
press fitting the engineered film to the shield.

13. The engineered film of claim 9, wherein the interlock feature comprises:
shrink fitting the engineered film to the shield.

14. A processing chamber, comprising:
a body having walls, a lid and a bottom defining a processing volume therein; and
a chamber component disposed in and exposed to the processing volume, the chamber component comprising:
a base component body having an exterior surface configured to face a processing environment of the processing chamber; and
a textured skin covering an entirety of the exterior surface and disposed between the exterior surface and processing volume, the textured skin conformable to the exterior surface, the textured skin having a first side configured to be disposed against the exterior surface and a second side facing away from the first side, the second side comprising a plurality of engineered features formed in a repetitive pattern and regularly spaced across the second side facing the processing volume, the engineered features configured to enhance adhesion of material deposited on the textured skin during use of the processing chamber.

15. The processing chamber of claim 14, wherein the chamber component of further comprises:
an adhesive disposed between the textured skin and the base component body wherein the adhesive bonds the textured skin thereto the base component body.

16. The processing chamber of claim 14, wherein the textured skin is press fit to the base component body and bonded thereto.

17. The processing chamber of claim 14, wherein the chamber component of further comprises:
a mechanical interlock disposed between the textured skin and the base component body bonding the textured skin thereto the base component body.

18. The processing chamber of claim 14, wherein the textured skin is shrink fit to the base component body to bond thereto.

19. The processing chamber of claim 14, wherein the textured skin is 3D printed on the base component body.

20. The processing chamber of claim 14, wherein the bond between the textured skin and the base component body is removable.

* * * * *